(12) United States Patent
Ke et al.

(10) Patent No.: US 10,362,645 B1
(45) Date of Patent: Jul. 23, 2019

(54) NEGATIVE CHARGE PUMP DOUBLING OUTPUT VOLTAGE RANGE FOR STEP-UP LED DRIVER

(71) Applicant: Linear Technology Holding, LLC, Norwood, MA (US)

(72) Inventors: Xugang Ke, Santa Clara, CA (US); Yaojie Xu, Sunnyvale, CA (US); Min Chen, Fremont, CA (US); Keith Szolusha, Saratoga, CA (US)

(73) Assignee: Linear Technology Holding, LLC, Norwood, MA (US)

( * ) Notice: Subject to any disclaimer, the term of this patent is extended or adjusted under 35 U.S.C. 154(b) by 0 days.

(21) Appl. No.: 16/127,928

(22) Filed: Sep. 11, 2018

Related U.S. Application Data

(60) Provisional application No. 62/659,577, filed on Apr. 18, 2018.

(51) Int. Cl.
*H02M 3/07* (2006.01)
*H05B 33/08* (2006.01)
*H03K 7/08* (2006.01)

(52) U.S. Cl.
CPC .......... *H05B 33/0815* (2013.01); *H02M 3/07* (2013.01); *H03K 7/08* (2013.01)

(58) Field of Classification Search
CPC .......................... H05B 33/08; H05B 33/0809; H05B 33/0815; H02M 3/00; H02M 3/005; H02M 3/07; H02M 2003/071; H02M 2003/072; H03K 7/00; H03K 7/08
See application file for complete search history.

(56) References Cited

U.S. PATENT DOCUMENTS

| | | | | |
|---|---|---|---|---|
| 2003/0231012 A1* | 12/2003 | Corva | ................... | H02M 3/156 323/285 |
| 2012/0044718 A1* | 2/2012 | Young | ............... | H02M 3/33523 363/17 |
| 2015/0061613 A1* | 3/2015 | Kondou | ................ | H02M 3/158 323/271 |
| 2018/0054121 A1* | 2/2018 | Chen | ..................... | H02M 3/158 |

* cited by examiner

*Primary Examiner* — Thai Pham
(74) *Attorney, Agent, or Firm* — Schwegman Lundberg & Woessner, P.A.

(57) ABSTRACT

A supply circuit comprises a regulated positive supply circuit and an unregulated negative supply circuit. The regulated positive supply circuit includes an inductor arranged to receive input energy from an input circuit node, a switch circuit coupled to the inductor at a switch circuit node, and a control circuit coupled to the switch circuit. The control circuit is configured to control activation of the switch circuit to regulate a voltage at a regulated circuit node and generate a positive output voltage at a positive output circuit node. The unregulated negative supply circuit is operatively coupled to the switch circuit node and is configured to generate a negative supply voltage at a negative output circuit node.

20 Claims, 4 Drawing Sheets

US 10,362,645 B1

NEGATIVE CHARGE PUMP DOUBLING OUTPUT VOLTAGE RANGE FOR STEP-UP LED DRIVER

FIELD OF THE DISCLOSURE

This document relates to integrated circuits and in particular to power converter circuits that provide a regulated voltage from an input voltage.

BACKGROUND

Electronic systems can include devices that require a regulated power source. Power converter circuits can be used to provide a regulated voltage to a load. However, there is typically a practical limit to the voltage that can be produced by a power converter circuit and delivered to a circuit load.

SUMMARY OF THE DISCLOSURE

This document relates generally to power converter circuits and methods of their operation. In some aspects, a supply circuit includes a regulated positive supply circuit and an unregulated negative supply circuit. The regulated positive supply circuit includes an inductor arranged to receive input energy from an input circuit node, a switch circuit coupled to the inductor at a switch circuit node, and a control circuit coupled to the switch circuit. The control circuit controls activation of the switch circuit to regulate a voltage at a regulated circuit node and generates a positive output voltage at a positive output circuit node. The unregulated negative supply circuit is operatively coupled to the switch circuit node and generates a negative supply voltage at a negative output circuit node.

In some aspects, a light emitting diode (LED) driver includes a regulated positive supply circuit, an unregulated negative supply circuit, a pulse width modulated (PWM) switch circuit arranged between the regulated circuit node and the positive output circuit node, and a load current sensing circuit element coupled to the PWM switch. The regulated positive supply circuit includes an inductor arranged to receive input energy from an input circuit node, a switch circuit coupled to the inductor at a switch circuit node, and a control circuit coupled to the switch circuit. The control circuit controls activation of the switch circuit to regulate a voltage at a regulated circuit node and generates a positive output voltage at a positive output circuit node. The unregulated negative supply circuit is operatively coupled to the switch circuit node and generates a negative supply voltage at a negative output circuit node. The control circuit modulates activation of the PWM switch circuit to control load current when a load is coupled between the positive output circuit node and the negative output circuit node.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Power converter circuits may be used to provide a regulated voltage that is a circuit supply for an electronic system. Some power converter circuits are switching power converter circuits that convert the input voltage to the regulated output voltage. For a step-up or boost power converter, the regulated voltage conversion can provide a regulated output voltage that is higher than the input voltage of the power converter circuit. In a conventional implementation of a step-up power converter there are practical limits on the voltage that can be created, and this can reduce the number of applications in which power converters can be used.

For example, in a conventional single stage step-up switching mode converter, with a fixed maximum duty ratio $D_{MAX}$, the maximum output voltage $V_{OUT,MAX}$ is:

$$V_{OUT,MAX} = V_{IN}/(1-D_{MAX}).$$

In a step-up converter with a high switching frequency ($f_{SW}$) up to 2 MHz, with the minimum switch ON-time of fifty nanoseconds (50 ns), and 90% $D_{MAX}$, the achievable $V_{OUT,MAX}$ is about 30 volts (30V) with a $V_{IN}$ of 3V. However, due to the maximum ON-time limitation in step-up converter, the conventional step-up converter cannot support applications that require a $V_{OUT}$ of 60V or greater.

Additionally, in a step-up converter where the switches are field effect transistor (FET) switches, to achieve a high $V_{OUT}$ relative to ground, FETs and diodes with a high voltage rating are required. High voltages switches can have an increased parasitic capacitance, and can increase the size and cost of the overall electronic system.

Also, a high voltage level shifter may need to be integrated into the controller for the step-up power converter circuit to support a higher driving voltage for the high voltage switches. Adding a level shifter can result in a high propagation delay for a switch gate driver, and again contribute to an increase in size and cost of the system. This can be especially true for a monolithic step-up converter with the switches and controller integrated on a single die. The maximum rating for devices of the fabrication process may limit the output voltage achievable. A high voltage step-up converter may also require a high electro-static discharge (ESD) clamp voltage on the IC die at $V_{OUT}$ which increases the chip size. A monolithic step-up converter that can implement a high voltage typically involves an increase in die size and cost. Further, the high voltage level may impair system safety and may require more physical board spacing.

These challenges to a implementing a high voltage power converter can be addressed by using a supply circuit that generates a positive output voltage and a negative output voltage, and operatively coupling the load between the positive and negative output voltages. This reduces the rating required for the circuit elements of the supply circuit.

Figure 1:
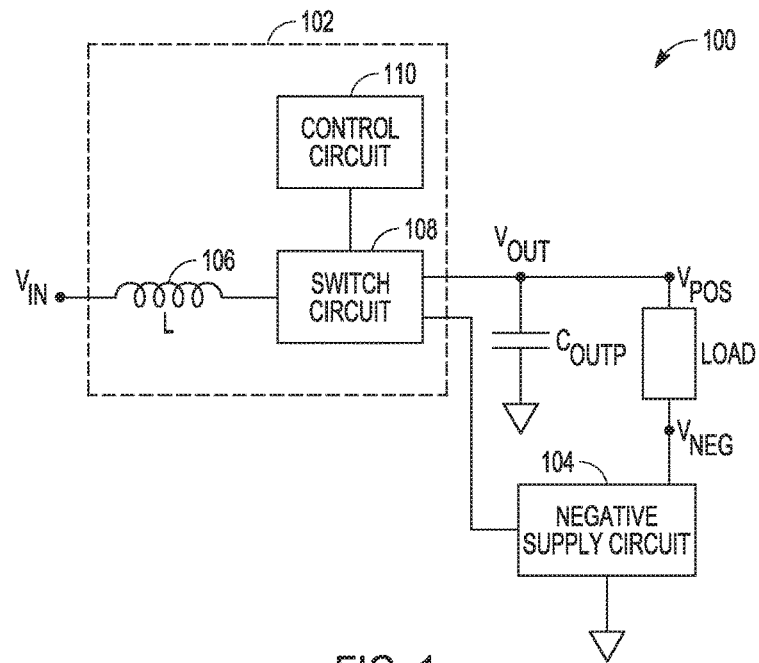
FIG. 1 is a block diagram of a supply circuit in an aspect.

FIG. 1 is a block diagram of a supply circuit 100. The supply circuit includes a regulated positive supply circuit 102 and an unregulated negative supply circuit 104. The regulated positive supply circuit 102 includes an inductor 106 arranged in the circuit to receive input energy from an input circuit node ($V_{IN}$). The regulated positive supply circuit 102 further includes a switch circuit 108 coupled to the inductor at a switch circuit node, and a control circuit coupled to the switch circuit. The control circuit 110 controls activation of the switch circuit to regulate a voltage at a regulated circuit node ($V_{OUT}$) and generate a positive output voltage at a positive output circuit node ($V_{POS}$).

The unregulated negative supply circuit is operatively coupled to the switch circuit node and generates a negative supply voltage at a negative output circuit node ($V_{NEG}$). In some embodiments, the voltage at $V_{POS}$ is the regulated voltage $V_{OUT}$, and the voltage at $V_{NEG}$ is a negative polarity of the regulated voltage $-V_{OUT}$. This produces a voltage of $2V_{OUT}$ across the circuit load without the demands on the circuit elements if the $2V_{OUT}$ is generated relative to circuit ground.

Figure 2:
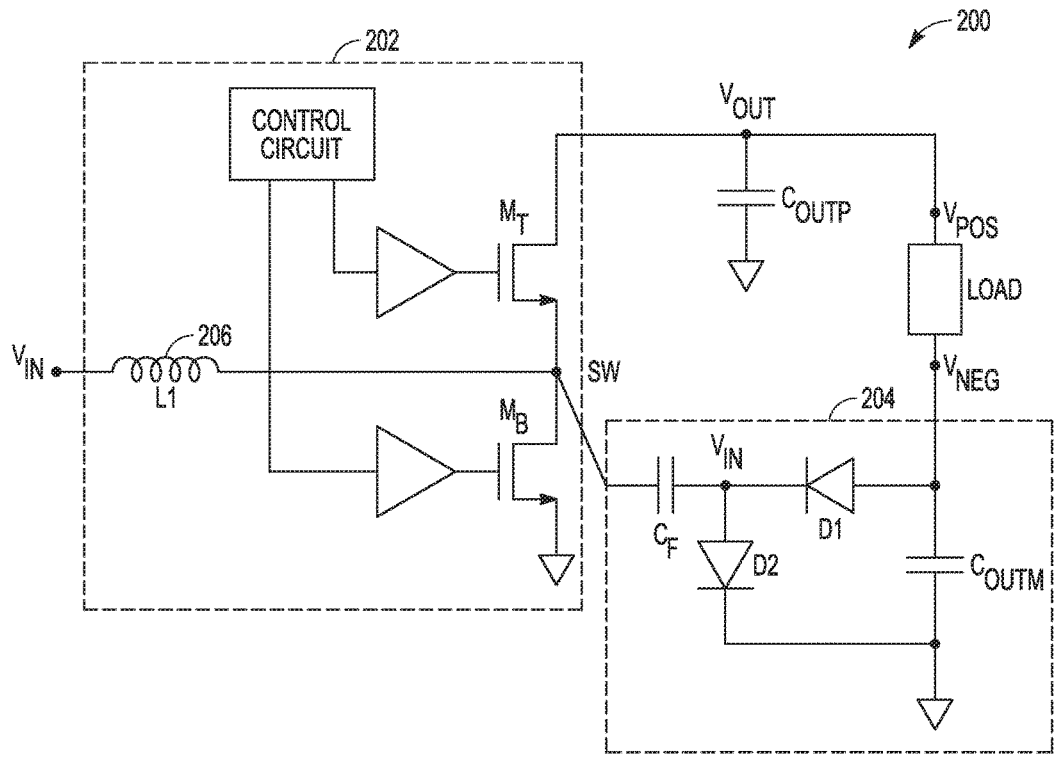
FIG. 2 is a circuit diagram of another example of a supply circuit in an aspect.

FIG. 2 is a circuit diagram of another example of a supply circuit 200. The supply circuit includes a regulated positive supply circuit 202 and an unregulated negative supply circuit 204. The regulated positive supply circuit 202 includes a switching power converter circuit. The switching power converter circuit includes inductor 206 and a switch circuit operatively coupled to a switch circuit node (SW). The switch circuit includes top switch ($M_T$) and bottom switch ($M_B$). The switches can be FETs. In the example of FIG. 2, the switching power converter circuit is a step-up converter. In variations, the switching power converter circuit is a step-down (buck) converter.

The unregulated negative supply circuit 204 includes a negative charge pump circuit connected to the switch circuit node. The negative charge pump circuit includes switching capacitor or fly-capacitor $C_F$ and diodes D1, D2.

When $M_B$ is active the inductor is charged. The time during which $M_B$ is active defines the "on time" of the duty ratio D. When $M_T$ is active (on), charge is transferred from the inductor to the regulated circuit node $V_{OUT}$ and the positive output circuit node ($V_{POS}$). The duty-cycling of $M_B$ and $M_T$ generates a regulated voltage $V_{OUT}$ at the regulated circuit node equal to a voltage at the input circuit node ($V_{IN}$) multiplied by the inverse of one minus the duty cycle (D) of the activation of the first transistor, or $V_{OUT}=V_{IN}/(1-D)$. (With a step-down converter circuit, the regulated voltage $V_{OUT}$ would be $V_{OUT}=D \cdot V_{IN}$.)

When $M_T$ is active, charge is transferred from the inductor to the regulated circuit node $V_{OUT}$ and the positive output circuit node $V_{POS}$, and the capacitor $C_F$ is charged to the positive $V_{POS}$ level and circuit node $V_N$ is at circuit ground. When $M_T$ is turned inactive (off) and $M_B$ becomes active (on), switch circuit node SW is pulled to circuit ground and the terminal of $C_F$ connected to circuit node SW is suddenly changed to ground. Because the $C_F$ resists the change and retains its charge, the voltage of circuit node $V_N$ changes from ground to a voltage of nearly ($-V_{OUT}$) and an unregulated negative supply voltage is created at $V_{NEG}$. During the MB activation phase, $C_F$ is discharged with a current flowing from load to $C_F$, generating the unregulated negative supply.

With the step-up switching power converter circuit, a maximum duty ratio of 90%, and an input voltage of 3V, the regulated voltage $V_{OUT}$ is about 30V. With $V_{POS}$=30V, and $V_{NEG}$=−30V, about 60V is generated across the circuit load. There will be a voltage drop in $V_{POS}$ due to switch $M_T$, and a voltage drop in $V_{NEG}$ due to diode D1. There will be a voltage drop in $V_{NEG}$ due to diodes D1 and D2. The absolute value of $V_{NEG}$ is two diode voltage drops smaller than $V_{OUT}$ due to D1 and D2.

Figure 3:
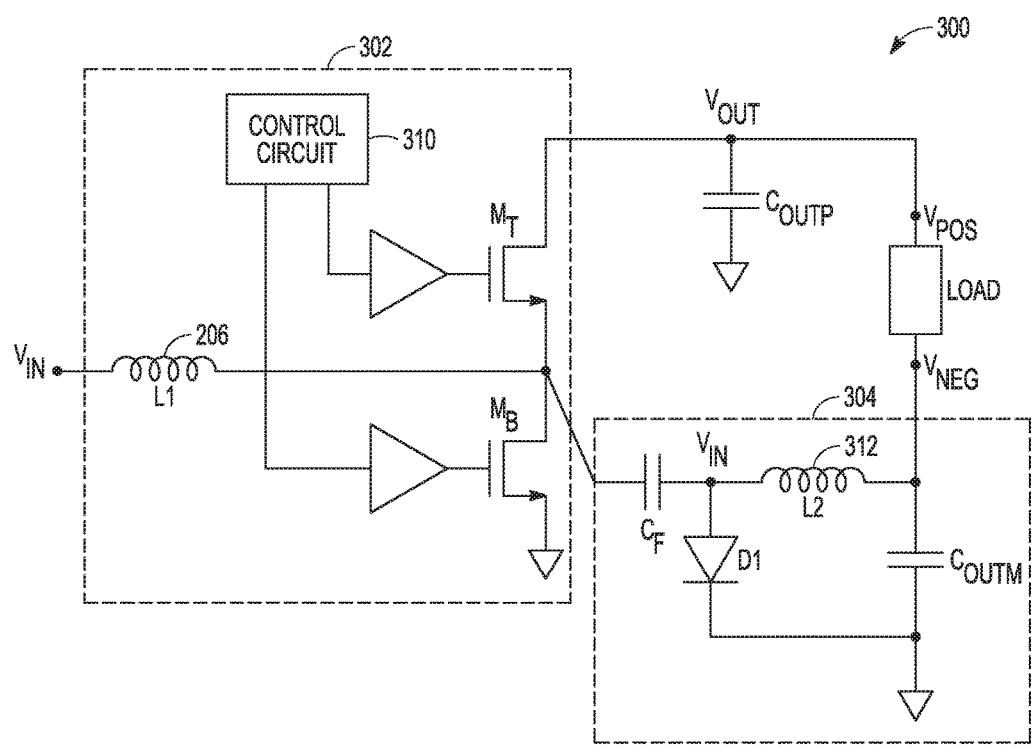
FIG. 3 is a circuit diagram of a further example of a supply circuit in an aspect.

FIG. 3 is a circuit diagram of another example of a supply circuit 300. The supply circuit includes a regulated positive supply circuit 302 and an unregulated negative supply circuit 304. As in the example of FIG. 2, the regulated positive supply circuit 302 can be a step-up switching power converter circuit, and can include inductor 306, control circuit 310, and a switch circuit including switches $M_T$ and $M_B$ operatively coupled to a switch circuit node (SW).

The unregulated negative supply circuit 304 includes a Cúk converter circuit. The Cúk converter circuit includes switching capacitor or fly-capacitor $C_F$, diode D1, and inductor 312. The Cúk converter circuit generates a negative output voltage at $V_{NEG}$. The control circuit regulates the voltage at regulated circuit node $V_{OUT}$ and the negative voltage generated at $V_{NEG}$ is unregulated. The Cúk converter circuit generates a negative output voltage equal to the negative value of the regulated output voltage multiplied by the duty ratio (D), or $V_{NEG}=-(V_{OUT} \cdot D)$. Because the regulated supply is a step-up power switching converter, $V_{OUT}=V_{IN}/(1-D)$ as in the example of FIG. 2. It can be seen that the supply circuit examples of FIGS. 1-3 are able to drive output loads that require a much higher voltage than the input voltage.

Figure 4:
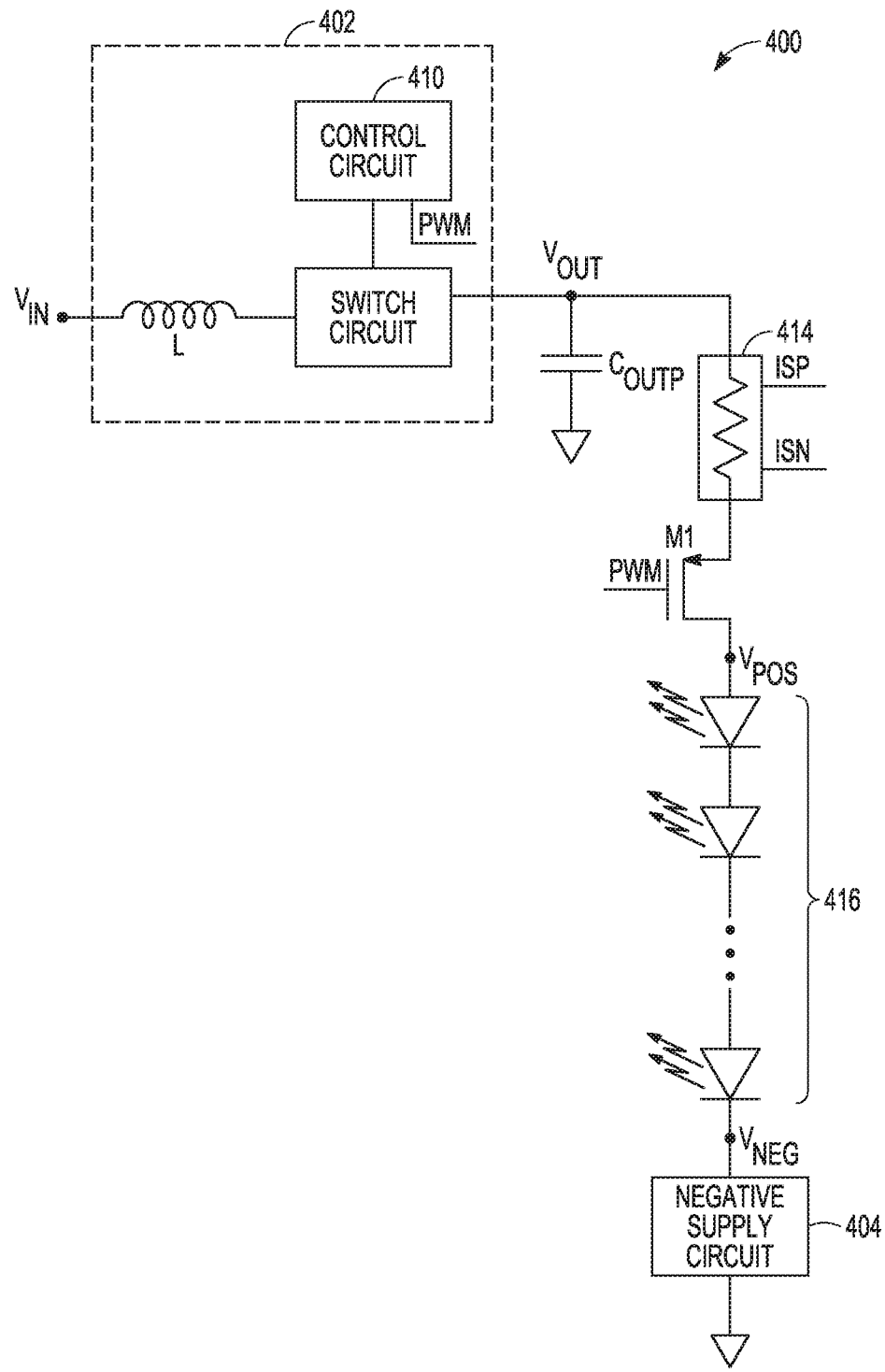
FIG. 4 is a block diagram of a light emitting driver (LED) driver circuit in an aspect.

FIG. 4 is a block diagram of a light emitting driver (LED) driver circuit 400 that includes a supply circuit. The LED driver circuit includes a regulated positive voltage supply circuit 402 and an unregulated negative supply circuit 404. The regulated positive voltage supply circuit 402 can include a step-up power converter circuit that generates a regulated voltage at the regulated circuit node $V_{OUT}$. The unregulated negative supply circuit 404 can be either a negative charge pump circuit as in FIG. 2 or a Cúk circuit of the example of FIG. 3. Because the net voltage across the load from $V_{POS}$ to $V_{NEG}$ can be greater than 60V, the LED driver circuit is able to drive more than 20 LEDs connected in series if each LED adds a voltage drop of 3V.

The LED driver circuit 400 also includes a pulse width modulated (PWM) switch circuit $M_1$ arranged between the regulated circuit node $V_{OUT}$ and the positive output circuit node $V_{POS}$, and a load current sensing circuit element 414 coupled to the PWM switch. In certain embodiments, the load current sensing circuit element 414 is a sense resistor that produces a voltage proportional to the load current. The control circuit 410 modulate activation of the PWM switch circuit to control load current. This can provide dimming capability to the string of LEDs 416 connected between the positive and negative output circuit nodes.

Figure 5:
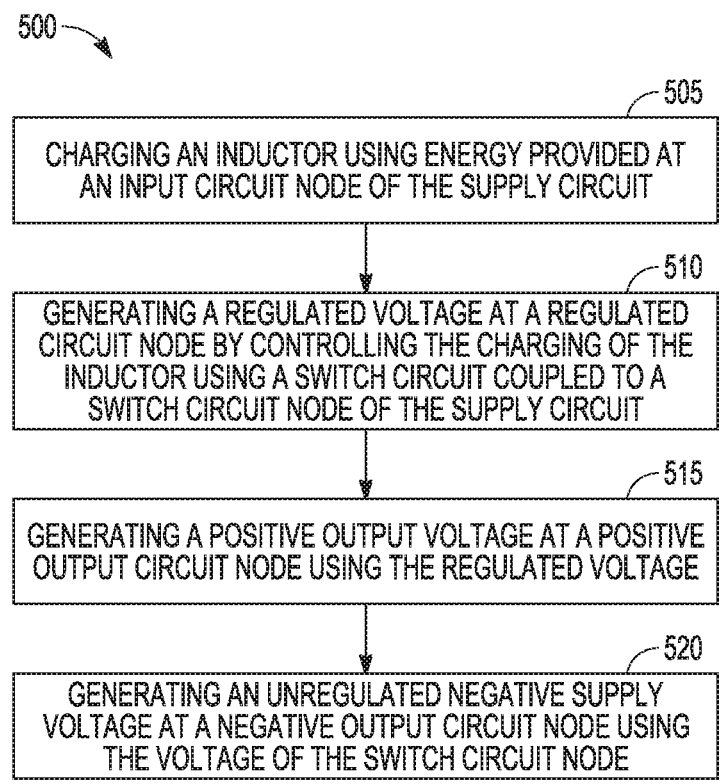
FIG. 5 is a flow diagram of a method of operating a supply circuit in an aspect.

For completeness, FIG. 5 is a flow diagram of a method 500 of operating a supply circuit. At 505, an inductor is charged using energy provided at an input circuit node of the supply circuit. At 510, a regulated voltage is generated at a regulated circuit node by controlling the charging of the inductor using a switch circuit coupled to a switch circuit node of the supply circuit. The regulated voltage can be generated using a step-up switch power converter circuit. The regulated voltage $V_{OUT}$ can be equal to a voltage at the input circuit node ($V_{IN}$) multiplied by the inverse of one minus the duty cycle (D) of the activation of the first transistor, or $V_{OUT}=V_{IN}/(1-D)$. In variations, the regulated voltage can be generated using a step-down switch power converter circuit, and the regulated voltage $V_{OUT}$ would be $V_{OUT}=D \cdot V_{IN}$.

At 515, a positive output voltage is generated at a positive output circuit node using the regulated voltage, and at 520, an unregulated negative supply voltage is generated at a negative output circuit node using the voltage of the switch circuit node. The unregulated negative supply voltage can be generated using a negative charge pump circuit or a Cúk converter circuit.

In some aspects, the positive output voltage and the unregulated negative supply voltage can be used to drive a string of LEDs connected in series. The number of LEDs that can be driven depends on the voltage rating of the boost converter. For the example described previously where $V_{POS}=30V$, and $V_{NEG}=-30V$, and about 60V generated across the circuit load, the boost converter can be used to drive a string of 20-25 LEDs. If the boost converter generates $V_{POS}=60V$, and $V_{NEG}=-60V$, about 120V is generated across the circuit load, and the generated voltage range can be used to drive a string of nearly 40 LEDs. Even higher voltage ranges can drive even greater numbers of LEDs.

It can be seen that the devices and methods described herein overcome the limitations of conventional step-up switch mode converter circuits. The circuits can support applications of twice the output ($2V_{OUT}$) of the conventional approaches. The rating of the circuit elements only needs to be $V_{OUT}$. If the switches ($M_T$, $M_B$, and the PWM switch $M_1$), capacitors, and diodes of the supply circuits have a 40V rating, the supply circuits can be used to generate 80V. This reduces the area required for an 80V circuit. In other examples, circuit elements with a rating of 30V can be used to implement a 60V circuit, or circuit elements with a 60V rating can be used to implement a 120V circuit. Additionally, ESD protection for only one-half the generated voltage range is needed. For the example of a boost converter with a rating of 40V, ESD protection for only 40V is needed and ESD protection for the full voltage range of 80V is not required.

ADDITIONAL DESCRIPTION AND ASPECTS

A first Aspect (Aspect 1) can include subject matter (such as a supply circuit) comprising a regulated positive supply circuit and an unregulated negative supply circuit. The regulated positive supply circuit includes an inductor arranged to receive input energy from an input circuit node, a switch circuit coupled to the inductor at a switch circuit node, and a control circuit coupled to the switch circuit. The control circuit is configured to control activation of the switch circuit to regulate a voltage at a regulated circuit node and generate a positive output voltage at a positive output circuit node. The unregulated negative supply circuit is operatively coupled to the switch circuit node and configured to generate a negative supply voltage at a negative output circuit node.

In Aspect 2, the subject matter of Aspect 1 optionally includes a regulated positive supply circuit including a switching power converter circuit and an unregulated negative supply circuit including a negative charge pump circuit.

In Aspect 3, the subject matter of Aspect 2 optionally includes a switch circuit that includes a first transistor coupled to the switch circuit node configured to charge the inductor when activated, and a second transistor coupled to the switch circuit node configured to transfer charge from the inductor to the regulated circuit node when activated. The unregulated negative supply circuit optionally includes a switching capacitor arranged between the switch circuit node and the negative output node. Activation of the first transistor of the switch circuit provides an unregulated negative voltage to the negative output circuit node.

In Aspect 4, the subject matter of Aspect 3 optionally includes a switch circuit in which activation of the second transistor charges the switching capacitor to the voltage of the regulated circuit node, and activation of the first transistor generates a negative polarity of the voltage of the regulated circuit node at the negative output circuit node.

In Aspect 5, the subject matter of Aspect 1 optionally includes a regulated positive supply circuit including a switching power converter circuit and an unregulated negative supply circuit including a Cúk converter circuit.

In Aspect 6, the subject matter of Aspect 5 optionally includes a switch circuit including a first transistor coupled to the switch circuit node and configured to charge the inductor when activated, and a second transistor coupled to the switch circuit node and configured to transfer charge from the inductor to the regulated circuit node when activated. The unregulated negative supply circuit optionally includes a switching capacitor and a negative supply inductor arranged between the switch circuit node and the negative output node.

In Aspect 7, the subject matter of one or any combination of Aspects 1-6 optionally includes a regulated positive supply circuit including a step-up converter circuit.

In Aspect 8, the subject matter of Aspect 7 optionally includes an input circuit node, and a switch circuit that includes a first transistor coupled to the switch circuit node configured to charge the inductor when activated, and a second transistor coupled to the switch circuit node configured to transfer charge from the inductor to the regulated circuit node when activated. A regulated voltage (Vout) between the regulated circuit node to circuit ground is equal to a voltage at the input circuit node (Vin) multiplied by the inverse of one minus the duty cycle (D) of the activation of the first transistor, or Vout=Vin/(1−D), and the voltage between circuit ground and the negative output circuit node is equal to a negative of the regulated voltage (−Vout).

In Aspect 9, the subject matter of one or any combination of Aspects 1-8 optionally includes a pulse width modulated (PWM) switch circuit arranged between the regulated circuit node and the positive output circuit node. The control circuit is optionally configured to modulate activation of the PWM switch circuit to control load current when a load is coupled between the positive output circuit node and the negative output circuit node.

Aspect 10 includes subject matter (such as a method comprising acts to control operation of a supply circuit), or can optionally be combined with one or any combination of Aspects 1-9 to include such subject matter comprising charging an inductor using energy provided at an input circuit node of the supply circuit, generating a regulated voltage at a regulated circuit node by controlling the charging of the inductor using a switch circuit coupled to a switch circuit node of the supply circuit, generating a positive output voltage at a positive output circuit node using the regulated voltage, and generating an unregulated negative supply voltage at a negative output circuit node using the voltage of the switch circuit node.

In Aspect 11, the subject matter of Aspect 10 optionally includes generating the unregulated negative supply voltage using a negative charge pump.

In Aspect 12, the subject matter of one or both of Aspects 10 and 11 optionally includes activating a first transistor coupled to the switch circuit node to charge the inductor; activating a second transistor coupled to the switch circuit node to transfer charge from the inductor to the regulated circuit node; and providing a negative unregulated voltage to the negative output circuit node when activating the first transistor.

In Aspect 13, the subject matter of Aspect 12 optionally includes activating the second transistor to charge the switching capacitor to the voltage of the regulated circuit node, and activating the first transistor to generate a negative polarity of the voltage of the regulated circuit node at the negative output circuit node.

In Aspect 14, the subject matter of one or any combination of Aspects 10, 12, and 13 optionally includes generating the unregulated negative supply voltage using a Cúk converter circuit.

In Aspect 15, the subject matter of one or any combination of Aspects 10-14 optionally includes generating the regulated voltage using a step-up converter circuit.

In Aspect 16, the subject matter of Aspect 15 optionally includes activating a first transistor coupled to the switch circuit node to charge the inductor, and activating a second transistor coupled to the switch circuit node to transfer charge from the inductor to the regulated circuit node. The generating the regulated voltage optionally includes generating a regulated voltage (Vout) between the regulated circuit node to circuit ground equal to a voltage at the input circuit node (Vin) multiplied by the inverse of one minus the duty cycle (D) of the activation of the first transistor, or Vout=Vin/(1−D). The generating the unregulated negative supply voltage optionally includes generating the unregulated negative supply voltage between circuit ground and the negative output circuit node equal to a negative polarity of the regulated voltage (−Vout).

In Aspect 17, the subject matter of one or any combination of Aspects 10-16 optionally includes modulating activation of a PWM switch circuit of the supply circuit to control load current when a load is coupled between the positive output circuit node and the negative output circuit node.

Aspect 18 includes subject matter (such as a light emitting diode (LED) driver circuit), or can optionally be combined with one or any combination of Aspects 1-17 to include such subject matter comprising a regulated positive supply circuit, an unregulated negative supply circuit, a pulse width modulated (PWM) switch circuit, and a load current sensing circuit element. The regulated positive supply circuit includes an inductor arranged to receive input energy from an input circuit node, a switch circuit coupled to the inductor at a switch circuit node, and a control circuit coupled to the switch circuit. The control circuit is configured to control activation of the switch circuit to regulate a voltage at a regulated circuit node and generate a positive output voltage at a positive output circuit node. The unregulated negative supply circuit is operatively coupled to the switch circuit node and configured to generate a negative supply voltage at a negative output circuit node. The PWM switch circuit is arranged between the regulated circuit node and the positive output circuit node, and the load current sensing circuit element is operatively coupled to the PWM switch. The control circuit is further configured to modulate activation of the PWM switch circuit to control load current when a load is coupled between the positive output circuit node and the negative output circuit node.

In Aspect 19, the subject matter of Aspect 18 optionally includes a regulated positive supply circuit including a switching power converter circuit and the unregulated negative supply circuit includes a negative charge pump circuit.

In Aspect 20, the subject matter of Aspect 18 optionally includes a regulated positive supply circuit including a switching power converter circuit and the unregulated negative supply circuit includes a Cúk converter circuit.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples" or "aspects." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A supply circuit comprising:
   a regulated positive supply circuit including:
      an inductor arranged to receive input energy from an input circuit node;
      a switch circuit coupled to the inductor at a switch circuit node; and
      a control circuit coupled to the switch circuit, the control circuit configured to control activation of the switch circuit to regulate a voltage at a regulated circuit node and generate a positive output voltage at a positive output circuit node; and an unregulated negative supply circuit operatively coupled to the switch circuit node and configured to generate a negative supply voltage at a negative output circuit node.

2. The supply circuit of claim 1, wherein the regulated positive supply circuit includes a switching power converter circuit and the unregulated negative supply circuit includes a negative charge pump circuit.

3. The supply circuit of claim 2,
wherein the switch circuit includes:
a first transistor coupled to the switch circuit node configured to charge the inductor when activated; and
a second transistor coupled to the switch circuit node configured to transfer charge from the inductor to the regulated circuit node when activated; and
wherein the unregulated negative supply circuit includes:
a switching capacitor arranged between the switch circuit node and the negative output node; and
wherein activation of the first transistor provides an unregulated negative voltage to the negative output circuit node.

4. The supply circuit of claim 3, wherein activation of the second transistor charges the switching capacitor to the voltage of the regulated circuit node, and the activation of the first transistor generates a negative polarity of the voltage of the regulated circuit node at the negative output circuit node.

5. The supply circuit of claim 1, wherein the regulated positive supply circuit includes a switching power converter circuit and the unregulated negative supply circuit includes a Cúk converter circuit.

6. The supply circuit of claim 5,
wherein the switch circuit includes:
a first transistor coupled to the switch circuit node configured to charge the inductor when activated; and
a second transistor coupled to the switch circuit node configured to transfer charge from the inductor to the regulated circuit node when activated; and
wherein the unregulated negative supply circuit includes:
a switching capacitor and a negative supply inductor arranged between the switch circuit node and the negative output node.

7. The supply circuit of claim 1, wherein the regulated positive supply circuit includes a step-up converter circuit.

8. The supply circuit of claim 7, including:
an input circuit node;
wherein the switch circuit includes:
a first transistor coupled to the switch circuit node configured to charge the inductor when activated; and
a second transistor coupled to the switch circuit node configured to transfer charge from the inductor to the regulated circuit node when activated; and
wherein a regulated voltage (Vout) between the regulated circuit node to circuit ground is equal to a voltage at the input circuit node (Vin) multiplied by the inverse of one minus the duty cycle (D) of the activation of the first transistor, or Vout=Vin/(1−D), and the voltage between circuit ground and the negative output circuit node is equal to a negative of the regulated voltage (−Vout).

9. The supply circuit of claim 1, including:
a pulse width modulated (PWM) switch circuit arranged between the regulated circuit node and the positive output circuit node;
wherein the control circuit is configured to modulate activation of the PWM switch circuit to control load current when a load is coupled between the positive output circuit node and the negative output circuit node.

10. A method of operating a supply circuit, the method comprising:
charging an inductor using energy provided at an input circuit node of the supply circuit;
generating a regulated voltage at a regulated circuit node by controlling the charging of the inductor using a switch circuit coupled to a switch circuit node of the supply circuit;
generating a positive output voltage at a positive output circuit node using the regulated voltage; and
generating an unregulated negative supply voltage at a negative output circuit node using the voltage of the switch circuit node.

11. The method of claim 10, wherein the generating the unregulated negative supply voltage includes generating the unregulated negative supply voltage using a negative charge pump.

12. The method of claim 10, including:
activating a first transistor coupled to the switch circuit node to charge the inductor;
activating a second transistor coupled to the switch circuit node to transfer charge from the inductor to the regulated circuit node; and
providing a negative unregulated voltage to the negative output circuit node when activating the first transistor.

13. The method of claim 12, wherein activating the second transistor charges the switching capacitor to the voltage of the regulated circuit node, and the activating the first transistor generates a negative polarity of the voltage of the regulated circuit node at the negative output circuit node.

14. The method of claim 10, wherein the generating the unregulated negative supply voltage includes generating the unregulated negative supply voltage using a Cúk converter circuit.

15. The method of claim 10, wherein the generating the regulated voltage includes generating the regulated voltage using a step-up converter circuit.

16. The method of claim 15, including:
activating a first transistor coupled to the switch circuit node to charge the inductor; and
activating a second transistor coupled to the switch circuit node to transfer charge from the inductor to the regulated circuit node;
wherein the generating the regulated voltage includes generating a regulated voltage (Vout) between the regulated circuit node to circuit ground equal to a voltage at the input circuit node (Vin) multiplied by the inverse of one minus the duty cycle (D) of the activation of the first transistor, or Vout=Vin/(1−D); and
wherein the generating the unregulated negative supply voltage includes generating the unregulated negative supply voltage between circuit ground and the negative output circuit node equal to a negative polarity of the regulated voltage (−Vout).

17. The method of claim 10, including modulating activation of a PWM switch circuit of the supply circuit to control load current when a load is coupled between the positive output circuit node and the negative output circuit node.

18. A light emitting diode (LED) driver, the LED driver comprising:
- a regulated positive supply circuit including:
  - an inductor arranged to receive input energy from an input circuit node;
  - a switch circuit coupled to the inductor at a switch circuit node; and
  - a control circuit coupled to the switch circuit, the control circuit configured to control activation of the switch circuit to regulate a voltage at a regulated circuit node and generate a positive output voltage at a positive output circuit node;
- an unregulated negative supply circuit operatively coupled to the switch circuit node and configured to generate a negative supply voltage at a negative output circuit node;
- a pulse width modulated (PWM) switch circuit arranged between the regulated circuit node and the positive output circuit node;
- a load current sensing circuit element operatively coupled to the PWM switch; and
- wherein the control circuit is further configured to modulate activation of the PWM switch circuit to control load current when a load is coupled between the positive output circuit node and the negative output circuit node.

19. The LED driver of claim 18, wherein the regulated positive supply circuit includes a switching power converter circuit and the unregulated negative supply circuit includes a negative charge pump circuit.

20. The LED driver of claim 18, wherein the regulated positive supply circuit includes a switching power converter circuit and the unregulated negative supply circuit includes a Cúk converter circuit.

* * * * *

UNITED STATES PATENT AND TRADEMARK OFFICE
CERTIFICATE OF CORRECTION

PATENT NO. : 10,362,645 B1
APPLICATION NO. : 16/127928
DATED : July 23, 2019
INVENTOR(S) : Ke et al.

Page 1 of 3

It is certified that error appears in the above-identified patent and that said Letters Patent is hereby corrected as shown below:

In the Drawings

Sheet 1 of 4, Fig. 2, delete:

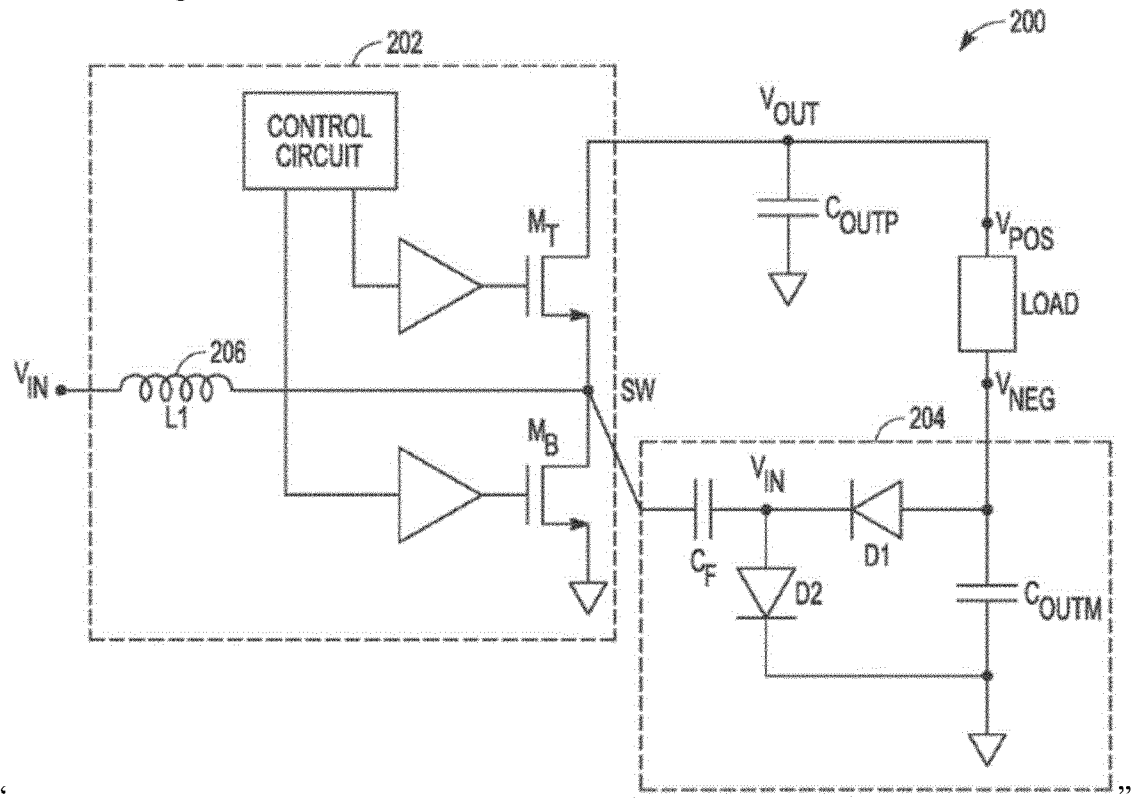

"                                                                                                              "

Signed and Sealed this
Twenty-eighth Day of April, 2020

Andrei Iancu
*Director of the United States Patent and Trademark Office*

CERTIFICATE OF CORRECTION (continued)
U.S. Pat. No. 10,362,645 B1

And insert:

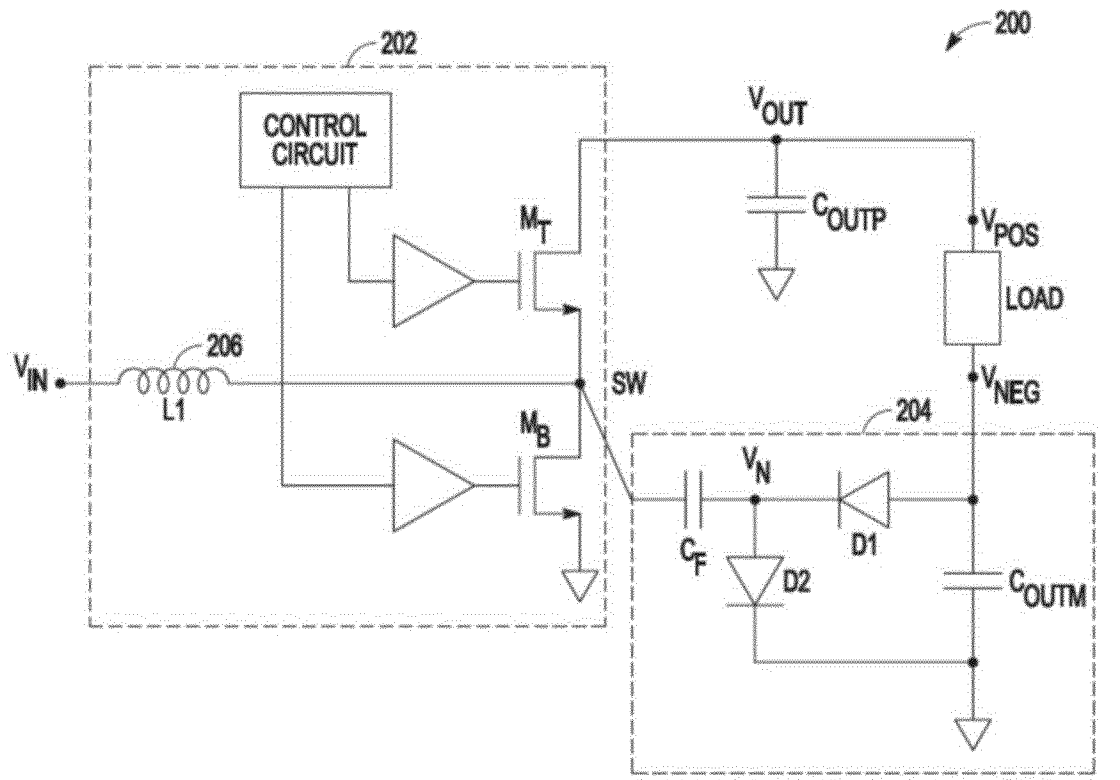

--
therefor

On Sheet 2 of 4, Fig. 3, delete:

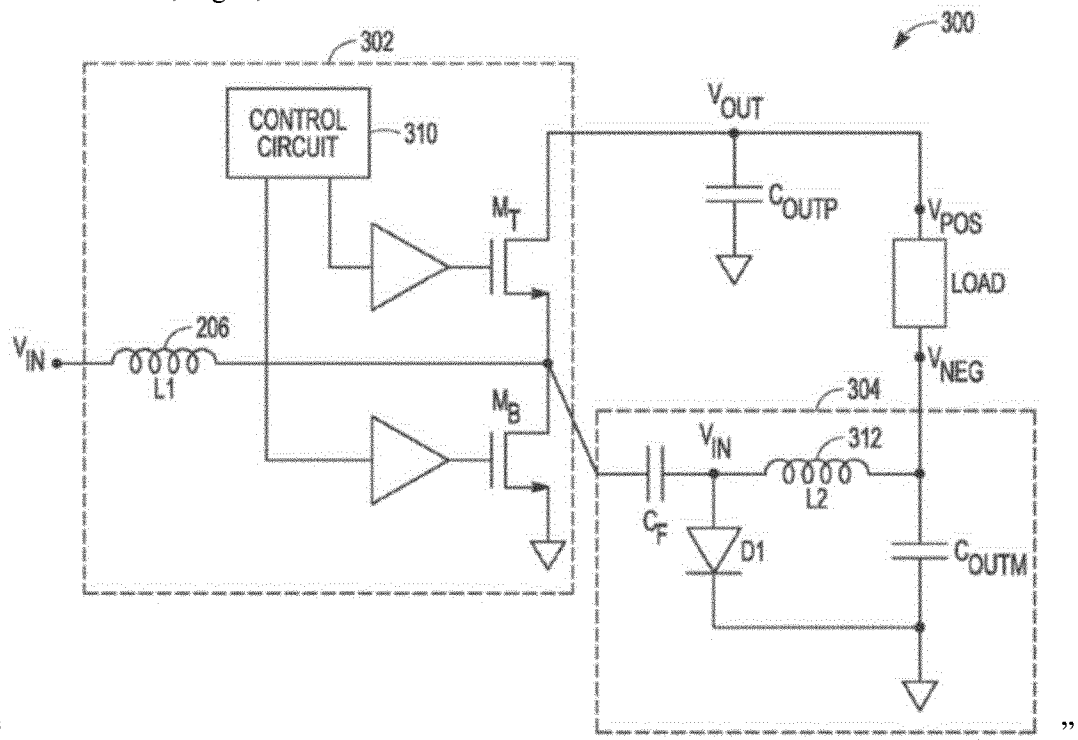

"                                                                              "

And insert:
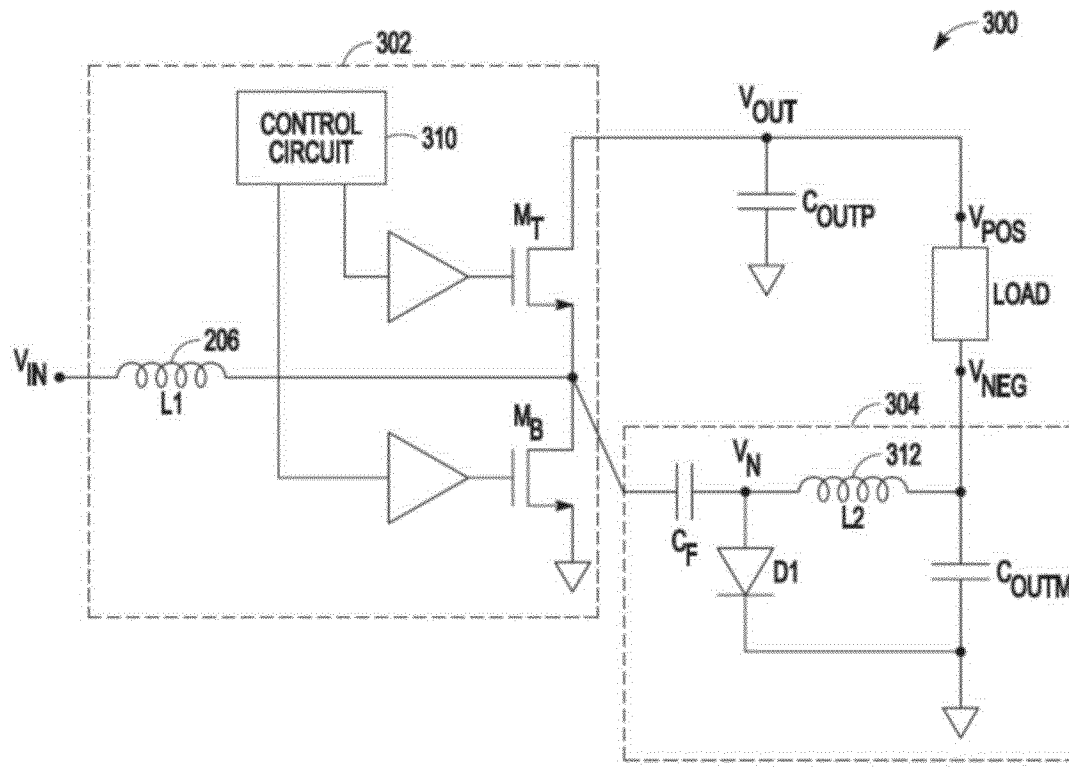
--
therefor